United States Patent
Tao

(10) Patent No.: US 11,776,841 B2
(45) Date of Patent: Oct. 3, 2023

(54) BURIED POWER RAIL CONTACT FORMATION

(71) Applicant: IMEC VZW, Leuven (BE)

(72) Inventor: Zheng Tao, Heverlee (BE)

(73) Assignee: Imec VZW, Leuven (BE)

( * ) Notice: Subject to any disclaimer, the term of this patent is extended or adjusted under 35 U.S.C. 154(b) by 160 days.

(21) Appl. No.: 17/459,384

(22) Filed: Aug. 27, 2021

(65) Prior Publication Data

US 2022/0181197 A1    Jun. 9, 2022

(30) Foreign Application Priority Data

Dec. 3, 2020    (EP) .................................... 20211727

(51) Int. Cl.
*H01L 21/74*    (2006.01)
*H01L 21/84*    (2006.01)
*H01L 23/522*    (2006.01)
*H01L 23/535*    (2006.01)

(52) U.S. Cl.
CPC .......... *H01L 21/743* (2013.01); *H01L 21/845* (2013.01); *H01L 23/5226* (2013.01); *H01L 23/535* (2013.01)

(58) Field of Classification Search
CPC . H01L 21/743; H01L 21/845; H01L 23/5226; H01L 23/535
USPC ......................................................... 438/637
See application file for complete search history.

(56) References Cited

U.S. PATENT DOCUMENTS

| 7,511,349 | B2 | 3/2009 | Tsai et al. |
| 8,314,025 | B2 | 11/2012 | Cho et al. |
| 10,586,765 | B2 | 3/2020 | Smith et al. |
| 11,101,217 | B2 * | 8/2021 | Xie .................. H01L 21/31116 |
| 2005/0212018 | A1 | 9/2005 | Schoellkopf et al. |
| 2018/0374791 | A1 | 12/2018 | Smith et al. |
| 2020/0135578 | A1 | 4/2020 | Ching et al. |
| 2020/0219813 | A1 | 7/2020 | Paul et al. |

FOREIGN PATENT DOCUMENTS

KR    20100022348 A    3/2010

OTHER PUBLICATIONS

Extended European Search Report from the European Patent Office, dated Jun. 1, 2021, for European Patent No. 20211727.1, pp. 1-5.

(Continued)

*Primary Examiner* — Tu-Tu V Ho
(74) *Attorney, Agent, or Firm* — McDonnell Boehnen Hulbert & Berghoff LLP

(57) ABSTRACT

A method is provided for forming a semiconductor product including providing a substrate comprising a buried power rail; forming a sacrificial plug at a contact surface on the buried power rail; applying a front-end-of-line module for forming devices in the semiconductor substrate; providing a Via, through layers applied by the front-end-module, which joins the sacrificial plug on the buried power rail; selectively removing the sacrificial plug thereby obtaining a cavity above the buried power rail; filling the cavity with a metal to electrically connect the devices with the buried power rail, wherein the sacrificial plug is formed such that the contact surface area is larger than an area of a cross-section of the Via parallel with the contact surface.

15 Claims, 13 Drawing Sheets

(56) References Cited

OTHER PUBLICATIONS

Harrison, S., et al., "Poly-gate REplacement Through Contact Hole (PRETCH): A New Method for High-K/Metal Cate and Multi-Oxide Implementation on Chip", IEDM Technical Digest. IEEE International Electron Devices Meeting, 2004, pp. 291-294.

Li, Y.T., et al., "The Amorphous-Si CMP Process Improvement for L14 nm FinFET Technology Node", International Conference on Planarization/CMP Technology, Nov. 19-21, 2014, Kobe, pp. 186-189.

Sakata, A., et al., "Solid Phase Replacement Process for Multilevel High-Aspect Ratio A1 Fill Applications", 1998, Proceedings of the IEEE 1998 International Interconnect Technology Conference (Cat. No. 98EX102), Microelectronics Engineering Laboratory, pp. 98-81 to 98-83.

\* cited by examiner

BURIED POWER RAIL CONTACT FORMATION

CROSS-REFERENCE

The present application claims priority from European patent application No. 20211727.1, filed on Dec. 3, 2020, which is incorporated by reference in its entirety.

FIELD OF THE DISCLOSURE

The present disclosure relates to buried power rails. More specifically it relates to the formation of a contact with a buried power rail.

BACKGROUND OF THE DISCLOSURE

Power rails, used for delivering power to the transistors of a chip, are typically implemented in the back-end-of-line.

In order to create more routing possibilities for the interconnects, buried power rails (BPR) may be applied before the front-end-of-line module.

Creating electrical contacts with these buried power rails is, however, very challenging in view of the resistivity of these contacts, especially with decreasing critical dimensions.

For example, the Via connect VBPR (Via connection with BPR) between a metallization layer M0 and the BPR may be scaled to 10-15 nm bottom CD in iN3 and beyond. This can create a major concern of its resistivity and its impact on the device performance.

FIG. 1 shows a schematic drawing of a vertical cross-section of a semiconductor product stack illustrating a BPR 110 in iN3. In this figure, a via (VBPR) is connected with a BPR. It can be seen that a decreasing CD can result in a decreasing contact surface between the VBPR and the BPR. This may even result in a width of the VBPR reducing to less than 12 nm. In this figure, neighboring 5T std cells with a width of 90 nm are shown. At the top side of the drawing metal interconnects are shown. In this example, the sum of the width of a metal interconnect and distance between two metal interconnects equals 18 nm. In this example, the BPR is formed in a Si substrate 105. An oxide 107 is present between the BPR and the substrate 105.

In view of this reduced resistivity with decreasing critical dimensions, there is a need to provide a method which allows to provide a good electrical connection between a buried power layer and a Via.

SUMMARY OF THE DISCLOSURE

It is an object of the present disclosure to provide a good method for electrically contacting a BPR.

The above objective is accomplished by a method and device according to the present disclosure.

Embodiments of the present disclosure relate to a method for forming a semiconductor product comprising a buried contact with a buried power rail.

The method comprises the following steps:
providing a semiconductor substrate comprising a buried power rail,
forming a sacrificial plug at a contact surface on the buried power rail,
applying a front-end-of-line module for forming devices in the semiconductor substrate,
providing a Via, through layers applied by the front-end-module, which joins the sacrificial plug on the buried power rail,
selectively removing the sacrificial plug thereby obtaining a cavity above the buried power rail,
filling the cavity with a metal to electrically connect the devices with the buried power rail, wherein the sacrificial plug is formed such that the contact surface area is larger than an area of a cross-section of the Via parallel with the contact surface.

One benefit of embodiments of the present disclosure is that the resistivity of the connection between the Via and the BPR can be reduced by providing a sacrificial plug at the contact surface before applying the front-end-module, and by replacing the sacrificial plug with a metal.

Another benefit of embodiments of the present disclosure is that the Via to BPR contact surface area can be enlarged and that it is not limited by the bottom critical dimension of the Via.

Particular aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

Figure 1:
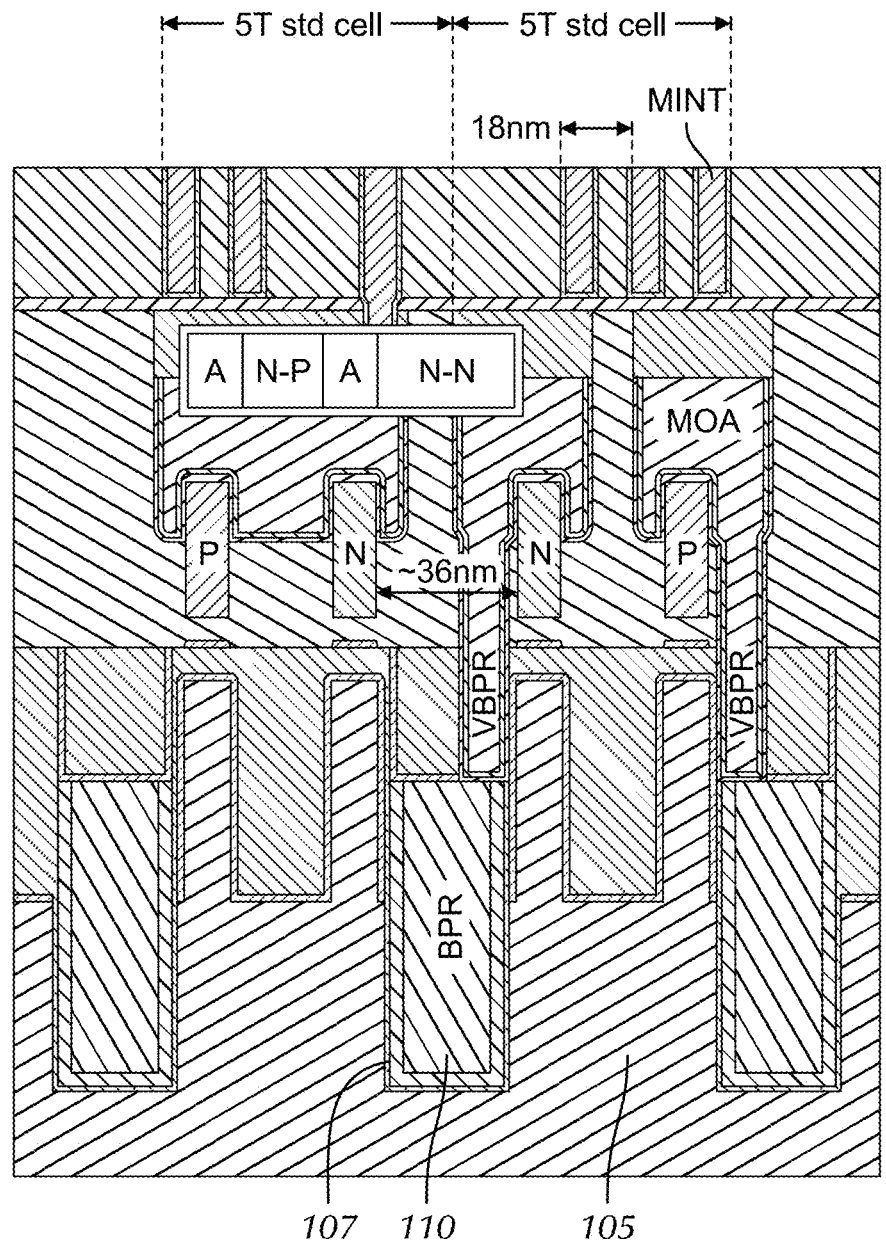
FIG. 1 shows a schematic drawing of a vertical cross-section of a semiconductor product stack illustrating a buried power rail.

Any reference signs in the claims shall not be construed as limiting the scope. In the different drawings, the same reference signs refer to the same or analogous elements.

DETAILED DESCRIPTION OF THE DISCLOSURE

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various aspects. This method of disclosure, however, is not to be interpreted as reflecting an intention that the claimed disclosure requires more features than are expressly recited in each claim. Rather, as the following claims reflect, aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Embodiments of the present disclosure relate to a method for forming a semiconductor product comprising a buried contact with a buried power rail.

Figure 10:
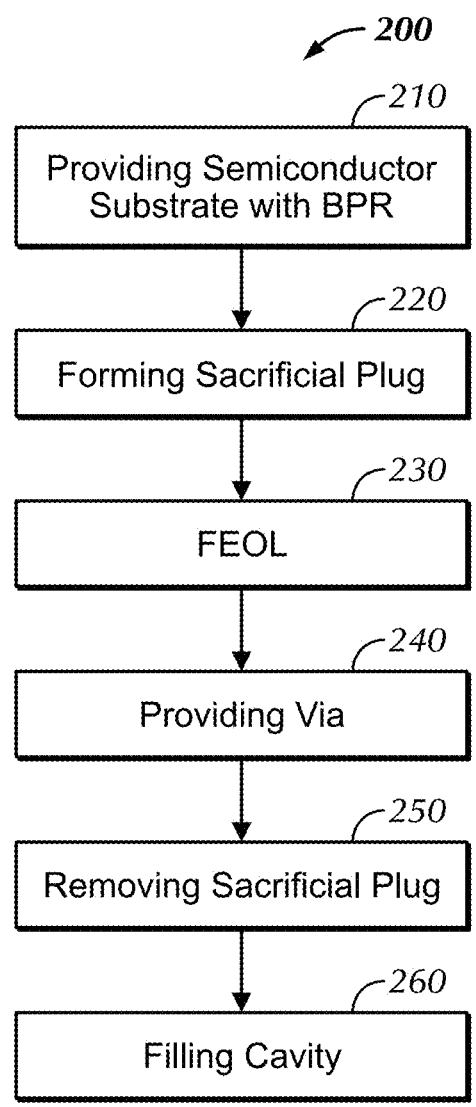
FIG. 10 shows a flow chart of an exemplary method in accordance with embodiments of the present disclosure.

An exemplary flow chart according to embodiments of the present disclosure is shown in FIG. 10 and is used as illustration only.

A method in accordance with embodiments of the present disclosure comprises at least the following steps:
providing 210 a semiconductor substrate comprising a buried power rail 110,
forming 220 a sacrificial plug 120 at a contact surface 130 on the buried power rail 110,
applying 230 a front-end-of-line module for forming devices 140 in the semiconductor substrate,
providing 240 a Via 150, through layers applied by the front-end-module, which joins the sacrificial plug 120 on the buried power rail 110,
selectively removing 250 the sacrificial plug 120 thereby obtaining a cavity above the buried power rail,
filling 260 the cavity with a metal 160 to electrically connect the devices 140 with the buried power rail 110, wherein the sacrificial plug 120 is formed such that the contact surface area is larger than an area of a cross-section of the Via 150 parallel with the contact surface.

Figure 2:
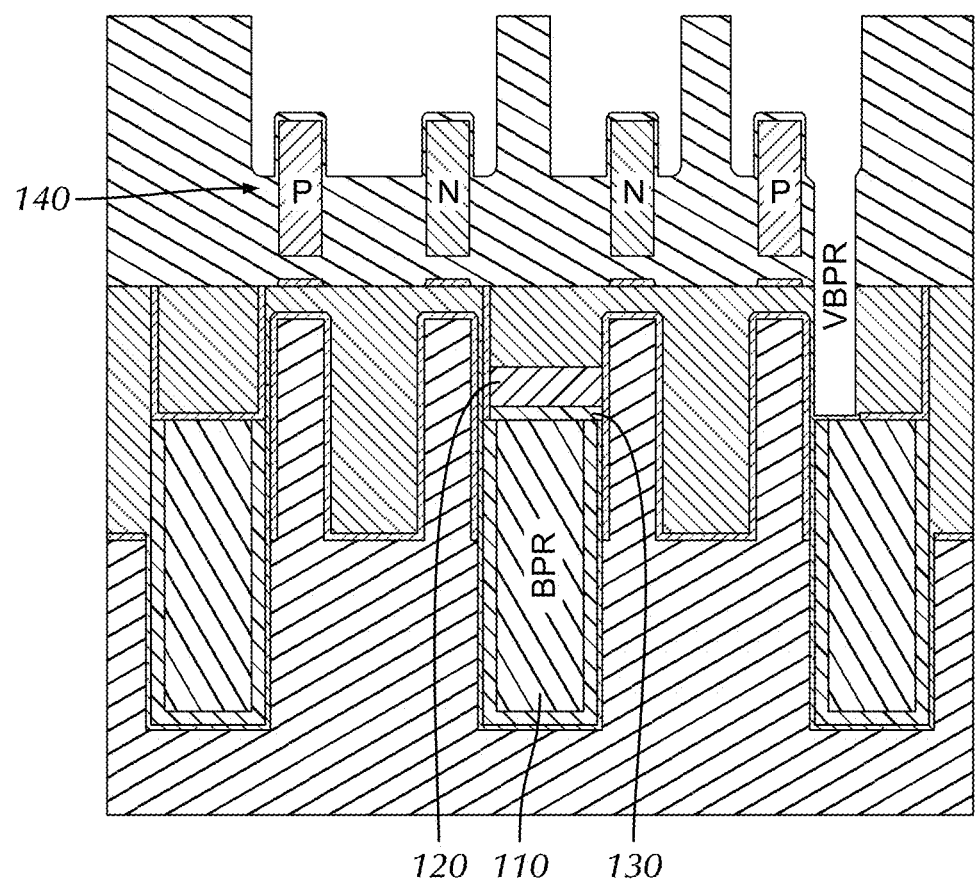
FIG. 2 shows a schematic drawing of a representative intermediate product, obtained by forming a sacrificial plug on a buried power rail, in accordance with embodiments of the present disclosure.

FIG. 2 shows a schematic drawing of a representative intermediate product, obtained by forming a sacrificial plug (also referred to as a buried plug) 120 on the liner 130, after BPR metal recess and after liner 130 deposition, in accordance with embodiments of the present disclosure. In this drawing also devices 140 are shown which may be formed by FEOL processing.

Figure 3:
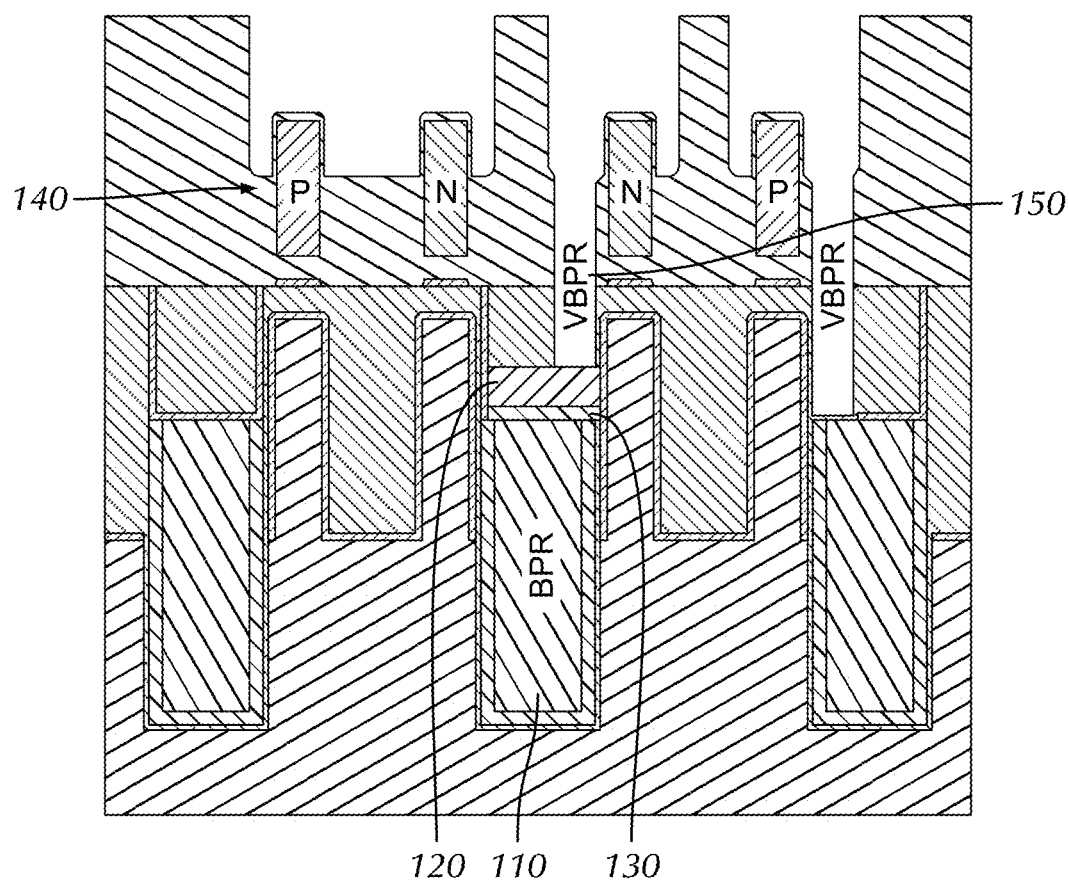
FIG. 3 shows a schematic drawing of a representative intermediate product, obtained after via etch landing on the buried plug, in accordance with embodiments of the present disclosure.

FIG. 3 shows a schematic drawing of a representative intermediate product, obtained after VBPR etch landing on the buried plug 120, in accordance with embodiments of the present disclosure.

Figure 4:
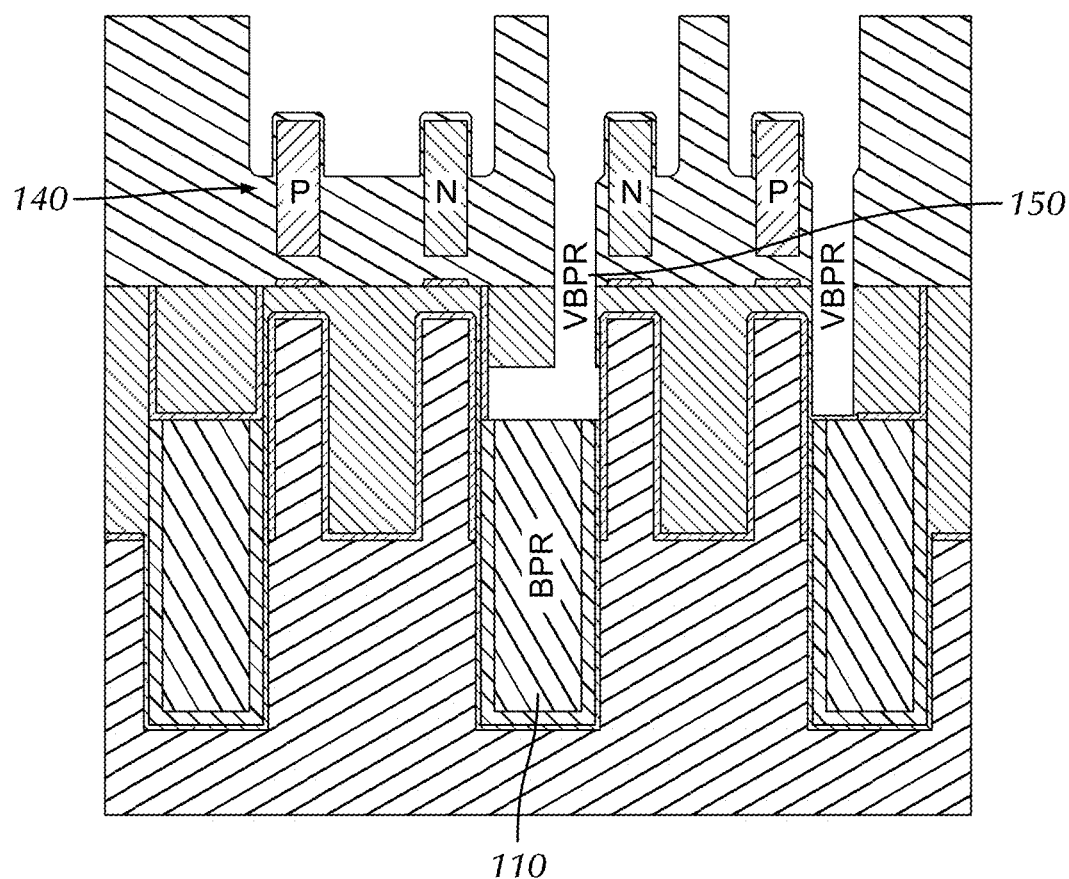
FIG. 4 shows a schematic drawing of a representative intermediate product, obtained after removal of the buried plug, in accordance with embodiments of the present disclosure.

FIG. 4 shows a schematic drawing of a representative intermediate product, obtained after removal of the buried plug, in accordance with embodiments of the present disclosure. In embodiments of the present disclosure, only the buried plug 120, or the buried plug 120 and the liner 130 on top of the BPR may be removed.

Figure 5:
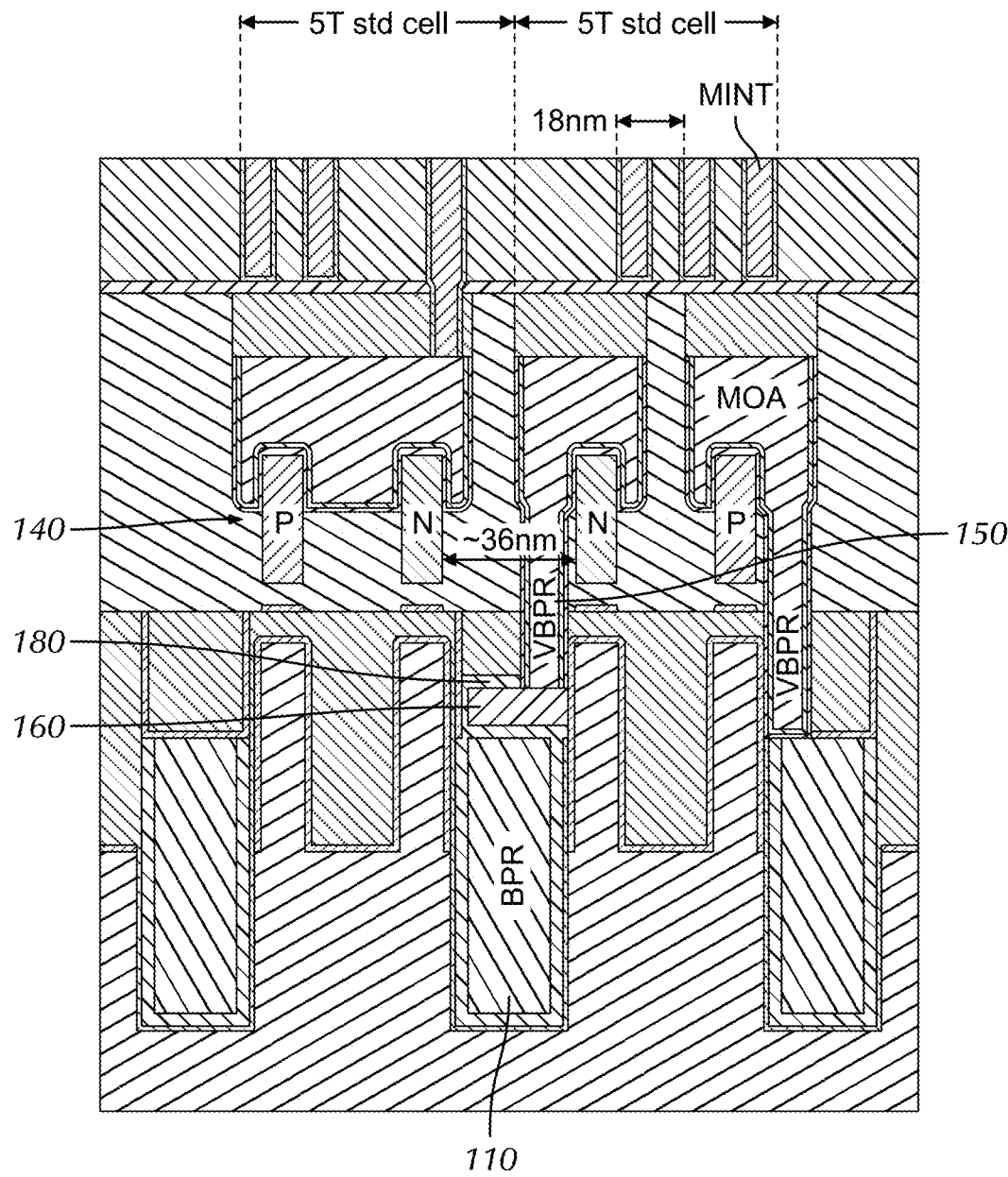
FIG. 5 shows a schematic drawing of a representative intermediate product, obtained after replacing the sacrificial buried plug with a metal, in accordance with embodiments of the present disclosure.

In embodiments of the present disclosure, the obtained cavity may be filled with a metal. FIG. 5 shows a schematic drawing of a representative intermediate product, obtained after replacing the sacrificial buried plug with a metal 160, in accordance with embodiments of the present disclosure.

In this figure, two Vias are shown. The left Via 150 is in contact with the BPR through the metal which is replacing the buried plug. Thus, a larger contact area is obtained than for the right Via which is a conventional Via in direct contact with the BPR. A benefit of embodiments of the present disclosure is that the VBPR and BPR contact surface can be enlarged to full BPR CD after replacing the plug with VBPR metal.

In embodiments of the present disclosure, the sacrificial plug 120 may be removed 250 by wet or isotropic selective etching.

In embodiments of the present disclosure, amorphous silicon may be used for forming 220 the sacrificial plug 120.

In embodiments of the present disclosure, amorphous carbon (APF) may be used for forming 220 the sacrificial plug 120.

In embodiments of the present disclosure, the sacrificial plug may be formed on top of the BPR at the position of the Via BPR landing area.

The step of forming 220 the sacrificial plug 120 at a contact surface 130 on the buried power rail 110 may be followed by an oxide fill step and a shallow trench isolation (STI) chemical-mechanical polishing step, followed by a conventional FEOL module.

Next, in embodiments of the present disclosure, a VBPR landing is achieved on the amorphous plug.

In embodiments of the present disclosure, the contact surface 130 may be the surface of the BPR itself.

In embodiments of the present disclosure, the contact surface 130 may be a liner.

In embodiments of the present disclosure, the sacrificial plug 120 is formed 220 after recess of the buried power rail metal and after deposition of a liner 130 on the buried power rail and wherein the liner 130 is removed after removing 250 the sacrificial plug and before filling 260 the cavity with the metal.

In embodiments of the present disclosure, a liner 131 may be deposited after forming 220 the sacrificial plug.

The liner 130, 131 on the buried power rail or on the sacrificial plug, also referred as the BPR liner, can protect the BPR metal surface from oxidation during STI oxide annealing.

The BPR liner 130 may be removed by wet or isotropic selective etching.

By filling the cavity, the VBPR is connected to the BPR. A benefit of embodiments of the present disclosure is that the contact surface with the BPR can be greatly enlarged compared to a conventional Via.

In embodiments of the present disclosure, filling the cavity with a metal may be achieved by atomic layer deposition (ALD) or metal on metal selective deposition for full filling the cavity formed after removal of the plug. Also, the remaining part may be filled by ALD or metal on metal selective deposition.

Alternatively, the remaining part may be filled by conventional chemical vapor deposition (CVD).

The metal may for example be W, Co, Ru, or Mo, or combinations of these metals. The disclosure is, however, not limited thereto.

Area selective deposition may be more attractive for filling the cavity because it is bottom up and barrier less. Area selective deposition allows selective deposition, metal on metal, and bottom up filling of the cavity.

In the example of FIG. 5, on the contrary, a barrier layer 180 may be formed by ALD deposition. Indeed, In the ALD case, a thin barrier layer is be deposited before the metal deposition. An ALD barrier such as Ti/TiN/TaN may be used for ALD W/Co/Ru deposition.

In metal on metal selective deposition, such as W or Ru, deposition of the barrier can be skipped, which can significantly reduce the metal/metal contact resistivity. FIG. 5 shows a stack obtained after applying metal lines (M0A), for example in a middle end of line layer, and metal interconnects (MINT), for example in a back end of line layer. In the example, the vias interconnect the metal lines (M0A) with the BPR.

Figure 6:
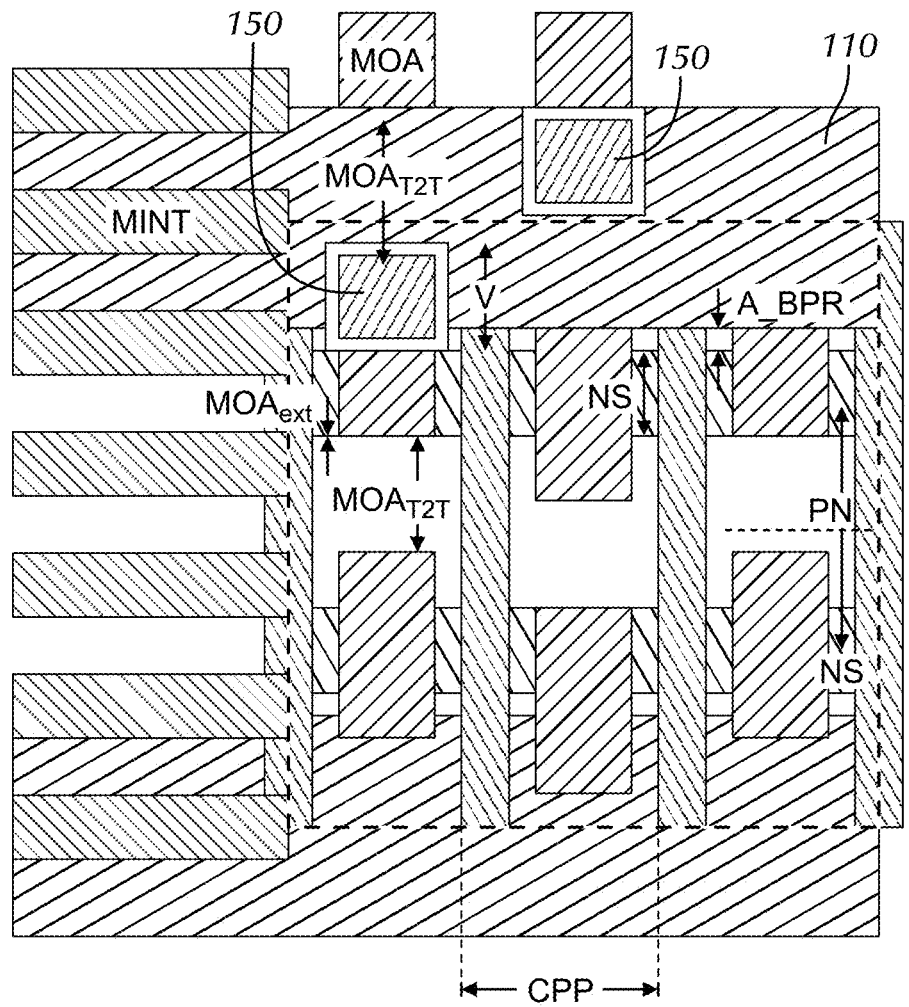
FIG. 6 shows a top view of a semiconductor device which is obtained after conventional via landing.

FIG. 6 shows a top view of a semiconductor device which is obtained after conventional via landing. FIG. 6 shows a 5-track std cell (90 nm) with metal interconnect pitch of 18 nm. In this example, the contacted poly pitch CPP is 42 nm. The metal interconnect (MINT) corresponds with the $1^{st}$ metal layer (horizontal). The hashed square 190 shows the available space for a VBPR 150 in a standard cell. As can be seen from this figure, the bottom CD of the contact between the Via 150 and the BPR 110 can be smaller than the top CD. In this example, the available space for VBPR in a std. cell is 12-18 nm, for a CPP of 42 nm and a gate length of 14 nm.

Figure 7:
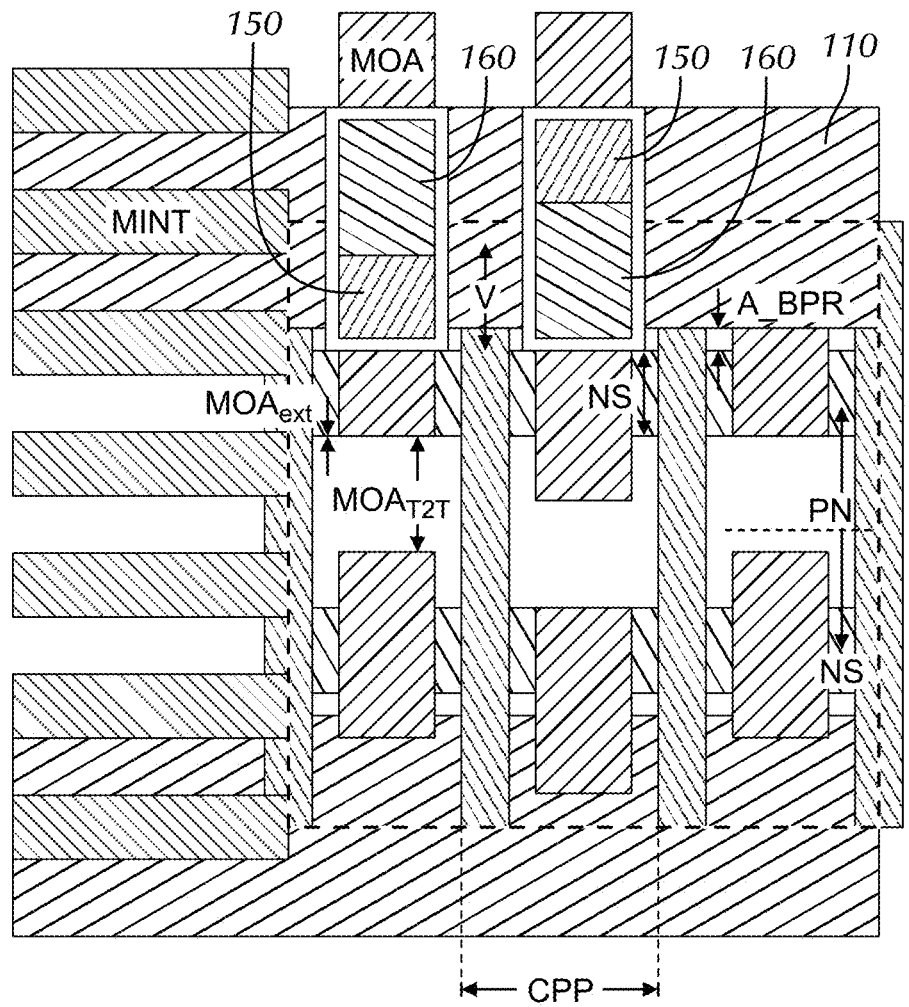
FIG. 7 shows a top view of a representative semiconductor device, for which the via bottom contact has a length which is extended to the full width of the buried power rail, and which is obtained using a method in accordance with embodiments of the present disclosure.
Figure 8:
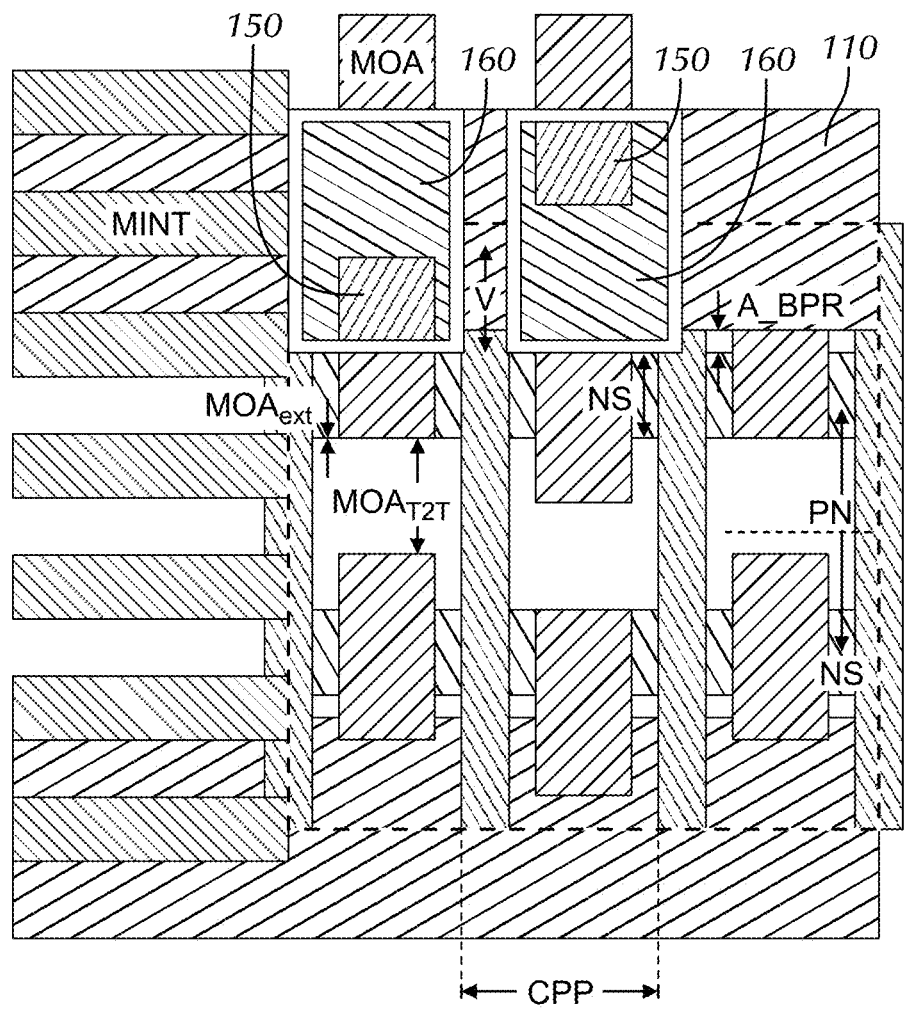
FIG. 8 shows a top view of a representative semiconductor device, for which the via bottom contact has an extended width compared to the width of the via in FIG. 6, and which is obtained using a method in accordance with embodiments of the present disclosure.

FIGS. 7 and 8 show top views of representative semiconductor devices which are obtained using a method in accordance with embodiments of the present disclosure.

In FIG. 7, the VBPR bottom contact 160 (i.e. the cavity filled with metal) has a length which is extended to the full BPR 110 width. For example, from 12-18 nm to 24-48 nm. The vias 150 land on the VBPR bottom contact 160. As can be seen from this figure, a bottom contact CD can be obtained which is significantly larger than a top CD. It is, moreover, a benefit that the Y CD (this is the dimension orthogonal to the BPR and parallel with the substrate) can self-align to the BPR. The reason therefore is that the VBPR Y bottom CD is the same as the BPR metal top CD.

Also in FIG. 8, the vias 150 land on the VBPR bottom contact 160. The VBPR bottom contact 160 has an extended bottom contact compared to the contact width of a conventional Via. As illustrated in FIG. 8 the VBPR bottom contact width may even be extended beyond the contacted poly pitch CPP. For example, from 12-18 nm to 30-50 nm. In this example the illustration is for nanosheet NS.

The plug area may, for example, be defined by the lithography print. The range can for example be the same as the M0A CD.

Figure 9:
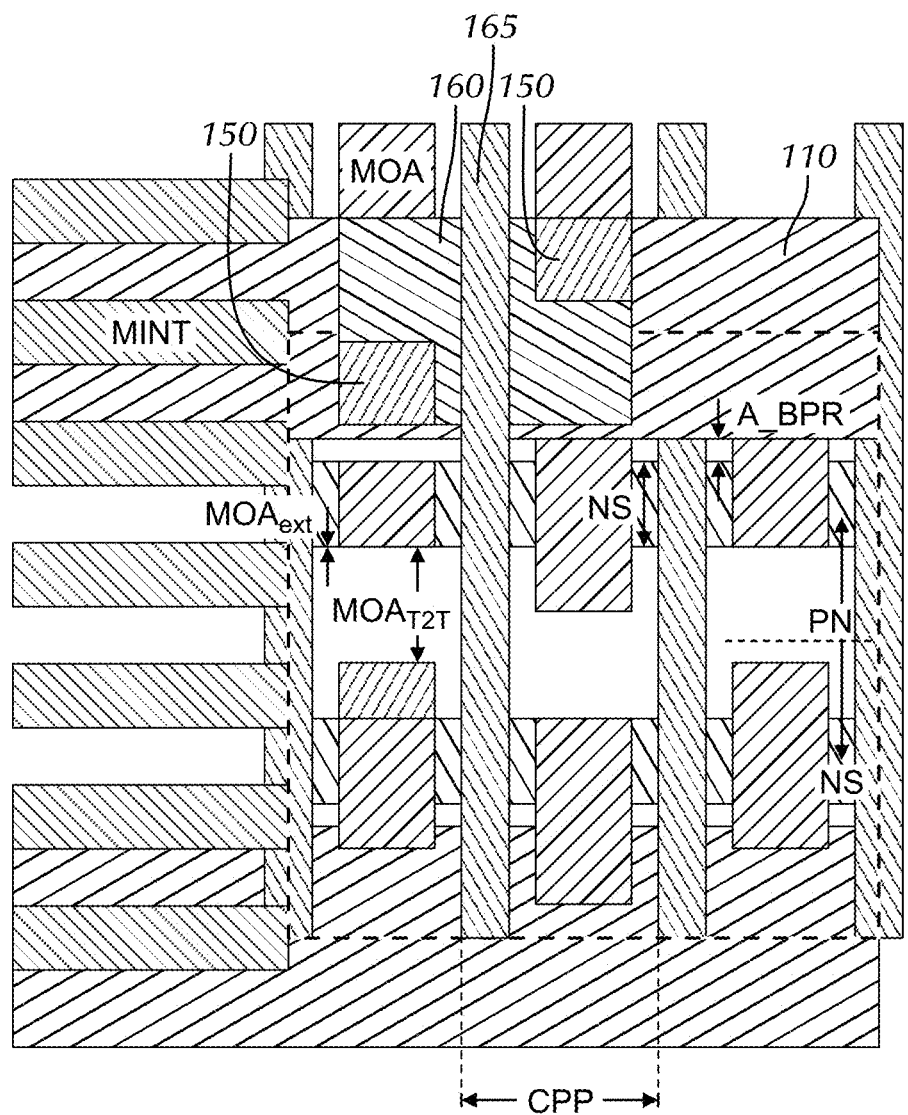
FIG. 9 shows a top view of a representative semiconductor device, for which the via bottom contact is shared between two vias, and which is obtained using a method in accordance with embodiments of the present disclosure.

In embodiments of the present disclosure, two neighboring VBPR may share the same via bottom contact, which allows for extension of the via bottom contact even more (e.g. to over 50 nm). FIG. 9 shows a top view of a semiconductor device, for which the via bottom contact 160 is shared between two vias 150, and which is obtained using a method in accordance with embodiments of the present disclosure. In embodiments of the present disclosure, the via bottom contact 160 is buried under the gate 165. In embodiments of the present disclosure, the VBPR may be self-aligned to the gate.

In embodiments of the present disclosure, the plug height may be limited by the BPR CD. In embodiments of the present disclosure, the plug may for example a height between 12 to 24 nm or 12 to 48 nm, depending on the BPR CD in design. It may, for example, have a height of 20 nm.

In embodiments of the present disclosure, the VBPR metal can, for example, be made of W, Co, Mo, or Ru or combination of these metals. The RMG Gate can, for example, be made of TiN, TaN, W or TiAlC. The M0A can for example be made of W, Co, Mo, or Ru. The BPR can for example be made of W, Co, Mo, or Ru.

A process flow was developed which allows for the decrease of the resistivity of the contact of the Via with the BPR. This process flow can be integrated in standard process flows which may for example comprise well implant, fin forming and STI, forming buried power rails, fin reveal, gate and spacer formation, source and drain epitaxial growth, activation anneal, ILD0, replacement metal gate, M0A, M0G, MIV0 as steps in the FEOL.

A benefit of a method, in accordance with embodiments of the present disclosure, is that the buried plug may be formed before the contact hole (i.e. the Via). In embodiments of the present disclosure, the sacrificial plug may be formed by lithography. By the use of a method in accordance with embodiments of the present disclosure, self-aligned contacts can be obtained. This can be essential for technologies with small CD (e.g. 3 nm node). As the buried plug is formed before the Via, self-aligned contacts can be obtained, and the Via etching aspect ratio can be reduced compared to methods where this self-alignment is not possible.

Buried power rails may, for example, be used to interconnect standard cells and/or to distribute power to the standard cells.

Figure 11:
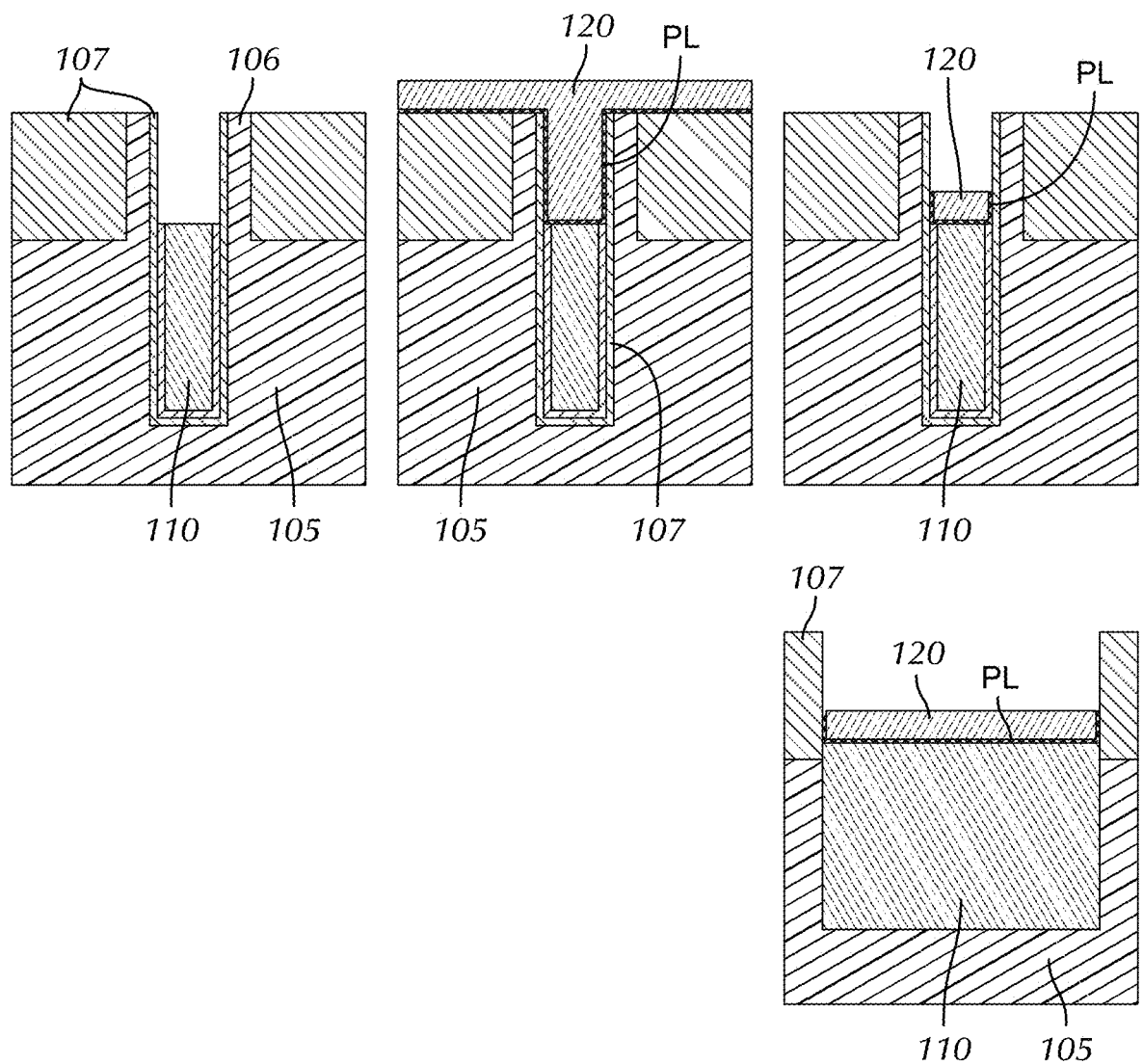
FIG. 11 shows cross-sections of representative intermediate products obtained using a method in accordance with embodiments of the present disclosure.

In embodiments of the present disclosure, a plug liner may be deposited first, and a BPR liner last. This is illustrated in FIG. 10 and FIG. 11.

Figure 12:
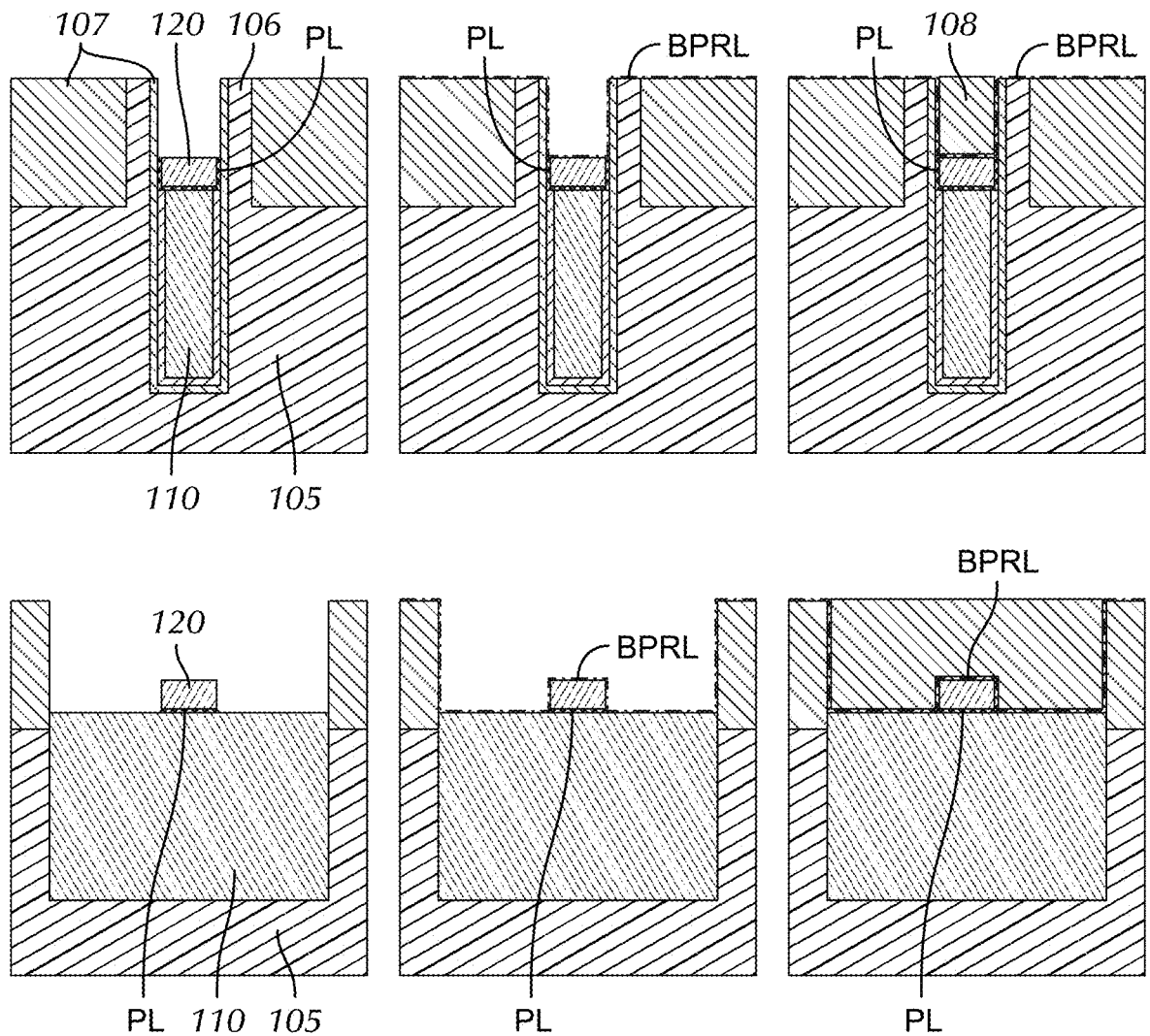
FIG. 12 shows cross-sections of representative intermediate products obtained using a method in accordance with embodiments of the present disclosure, wherein a plug liner is deposited before a buried power rail liner.
Figure 13:
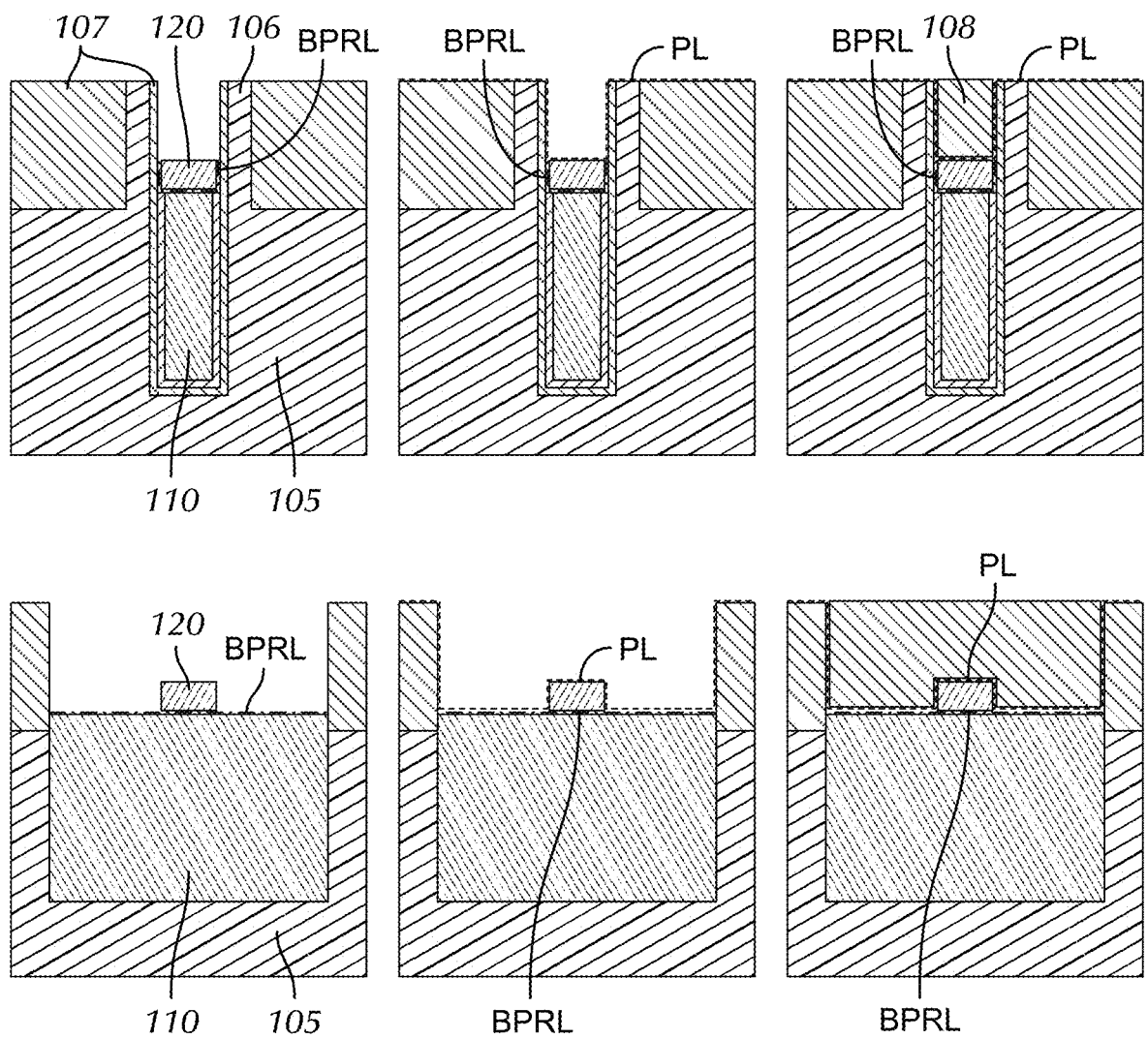
FIG. 13 shows cross-sections of representative intermediate products obtained using a method in accordance with embodiments of the present disclosure, wherein a buried power rail liner is deposited before a plug liner.

Alternatively, in embodiments of the present disclosure, a BPR liner may be deposited first followed by the deposition of a plug liner. This is illustrated in FIG. 12.

The top schematic drawings in FIG. 10 shows cross-sections of intermediate products obtained using a method in accordance with embodiments of the present disclosure. The top cross-sections can be made orthogonal with the BPR 110. The bottom cross-section can be made along the BPR (i.e. in the length direction of the BPR and orthogonal to the substrate 105.

In the examples, the substrate 105 can be a silicon substrate. The top left cross-section shows a BPR 110 obtained after BPR metal recess. The BPR 110 comprises a metal in a trench of the substrate 105. The walls of the trench can be covered by oxide 107. The figures also shows STI oxides 107. Between the STI oxides and the trench, fins 106 are shown.

The second drawing from the left shows an intermediate product obtained after depositing a plug liner PL (e.g. oxide) and after depositing plug material 120 (e.g. aSi or APF). In embodiments of the present disclosure, the plug liner PL may be skipped, depending on the plug material and the BPR metal type.

In embodiments of the present disclosure, at this stage of the process, a BPR liner (e.g. $SiO_2$) instead of a plug liner may be deposited. The BPR liner deposition step may be followed by a plug material deposition step. (e.g. aSi or APF). It is noted that in case of using a SiN BPR liner, it may be more difficult to remove it after sacrificial plug removal. No mask may be required.

The third top drawing from the left shows a schematic drawing of an intermediate stack obtained after chemical mechanical polishing (CMP) of the plug and after etching back of the plug 120. The corresponding drawing at the bottom of the figure shows a cross-section of the same intermediate stack, cut along the BPR.

Similarly as in FIG. 10, the top drawings in FIG. 11 show cross-sections of intermediate stacks, orthogonal to the BPR and the bottom drawings show the corresponding cross-sections along the BPR, wherein the intermediate stacks are obtained using a method in accordance with embodiments of the present disclosure.

The first drawings from the left show the intermediate stacks obtained after patterning of the sacrificial plug 120. This may be achieved by lithography/etch patterning and can be self-aligned to the BPR width (e.g. through block print, defining the sacrificial plug size, and landing on BPR).

The middle drawings show an intermediate stack obtained after a BPR liner (BPRL) deposition, in accordance with embodiments of the present disclosure. The BPR liner may for example be a SiN liner.

The right drawings show an intermediate stack obtained after STI oxide fill 108 and CMP, in accordance with embodiments of the present disclosure. Starting from such a stack, a stack as in FIG. 5 can be obtained, by applying method steps in accordance with embodiments of the present disclosure.

The drawings in FIG. 12 show intermediate stack in case a BPR liner BPRL is deposited before the deposition of a plug liner PL. The top cross-sections are made orthogonal with the BPR 110. The bottom cross-section are made along the BPR (i.e. in the length direction of the BPR and orthogonal to the substrate. The first drawings from the left show the intermediate stacks obtained after patterning of the sacrificial plug. This may be achieved by lithography/etch patterning and can be self-aligned to the BPR width (e.g. through block print, defining the sacrificial plug size, and landing on the BPR liner).

The second drawings from the left show the intermediate stack obtained after plug liner PL deposition in accordance with embodiments of the present disclosure. The plug liner may for example be a SiN liner, or a SiO liner. A plug liner is, however, not strictly required. The right drawings show an intermediate stack obtained after STI oxide fill and CMP, in accordance with embodiments of the present disclosure.

The invention claimed is:

1. A method for forming a semiconductor product comprising a buried contact with a buried power rail, the method comprising:
   providing a semiconductor substrate comprising the buried power rail;
   forming a sacrificial plug at a contact surface on the buried power rail;
   applying a front-end-of-line module for forming devices in the semiconductor substrate;
   providing a Via through layers applied by the front-end-of-line module, which joins the sacrificial plug on the buried power rail;
   selectively removing the sacrificial plug thereby obtaining a cavity above the buried power rail; and
   filling the cavity with a metal to electrically connect the devices with the buried power rail, wherein the sacrificial plug is formed such that an area of the contact surface is larger than an area of a cross-section of the Via parallel with the contact surface.

2. The method according to claim 1, wherein the sacrificial plug is removed by wet or isotropic selective etching.

3. The method according to claim 1, wherein amorphous silicon is used for forming the sacrificial plug.

4. The method according to claim 1, wherein amorphous carbon is used for forming the sacrificial plug.

5. The method according to claim 1, wherein the sacrificial plug is formed after recess of a buried power rail metal and after deposition of a liner on the buried power rail and wherein the liner is removed after removing the sacrificial plug and before filling the cavity with the metal.

6. The method according to claim 1, wherein a liner is deposited after forming the sacrificial plug.

7. The method according to claim 1, wherein filling the cavity with the metal is done using area selective deposition.

8. The method according to claim 1, wherein filling the cavity with the metal is done using metal on metal selective deposition.

9. The method according to claim 1, wherein the sacrificial plug is formed at a position of a Via buried power rail landing area.

10. The method according to claim 1, wherein the contact surface includes a liner.

11. The method according to claim 10, wherein the liner is removed after the removal of the sacrificial plug.

12. The method according to claim 11, wherein the liner is removed by wet or isotropic selective etching.

13. The method according to claim 1, wherein a liner is deposited on the contact surface before forming the sacrificial plug.

14. The method according to claim 1, wherein the buried power rail is made of a metal selected from the group consisting of W, Co, Mo or Ru.

15. The method according to claim 1, wherein prior to the forming of the sacrificial plug, a liner is deposited on the contact surface followed by deposit of a liner onto the buried power rail.

* * * * *